(12) United States Patent
Yajima

(10) Patent No.: US 7,878,375 B2
(45) Date of Patent: Feb. 1, 2011

(54) CHEMICAL LIQUID SUPPLY DEVICE

(75) Inventor: Takeo Yajima, Tokyo (JP)

(73) Assignee: Koganei Corporation, Tokyo (JP)

( * ) Notice: Subject to any disclaimer, the term of this patent is extended or adjusted under 35 U.S.C. 154(b) by 600 days.

(21) Appl. No.: 11/774,686

(22) Filed: Jul. 9, 2007

(65) Prior Publication Data

US 2008/0011781 A1    Jan. 17, 2008

(30) Foreign Application Priority Data

Jul. 11, 2006    (JP) .............................. 2006-190460

(51) Int. Cl.
G01F 11/00    (2006.01)
(52) U.S. Cl. .................. 222/318; 222/504; 222/108; 251/65; 239/124; 118/300; 118/323
(58) Field of Classification Search ............... 222/318, 222/424, 504, 108, 109; 118/300, 323, 302; 239/104, 124; 251/65
See application file for complete search history.

(56) References Cited

U.S. PATENT DOCUMENTS

| | | | | |
|---|---|---|---|---|
| 4,687,137 A | * | 8/1987 | Boger et al. | 239/124 |
| 4,940,207 A | * | 7/1990 | Katsuyama | 251/65 |
| 5,536,313 A | * | 7/1996 | Watanabe et al. | 222/318 |
| 5,685,911 A | * | 11/1997 | Raterman et al. | 118/324 |
| 6,089,413 A | * | 7/2000 | Riney et al. | 222/318 |
| 6,607,104 B2 | * | 8/2003 | McGuffey | 222/318 |

2005/0238504 A1   10/2005   Yajima

FOREIGN PATENT DOCUMENTS

| | | |
|---|---|---|
| JP | 61-193268 | 12/1985 |
| JP | 61-067861 | 5/1986 |
| JP | 7211625 A | 8/1995 |
| JP | 08-170744 | 7/1996 |
| JP | 09-299862 | 11/1997 |
| JP | 10-061558 | 3/1998 |
| JP | 2004330119 A | 11/2004 |
| JP | 2005305396 A | 11/2005 |

OTHER PUBLICATIONS

Machine Translation of Japanese Patent Application Laid-Open Publication No. 2004-330119.*
Machine Translation of Japanese Patent Application Laid-Open Publication No. 07-211625.*
Office Action from corresponding Japanese application No. JP 2006-190460 dated Feb. 2, 2010 and its translation (5 pages).

* cited by examiner

Primary Examiner—Kevin P Shaver
Assistant Examiner—Jonathan Wood
(74) Attorney, Agent, or Firm—McCormick, Paulding & Huber LLP

(57) ABSTRACT

A chemical liquid supply device applies chemical liquid from a nozzle to a processed object. The nozzle is provided in a moving head, which reciprocates between an applying position and a waiting position and includes an application valve operating so as to take an applying state of applying the liquid from the nozzle and a stopped state of stopping the application. Chemical liquid is pumped from a tank through a filter to a valve chamber of the application valve via a supply tube. The valve chamber is connected to a buffer tank through a circulation tube. The circulation tube is provided with a circulation valve for opening/closing its flow path.

12 Claims, 10 Drawing Sheets

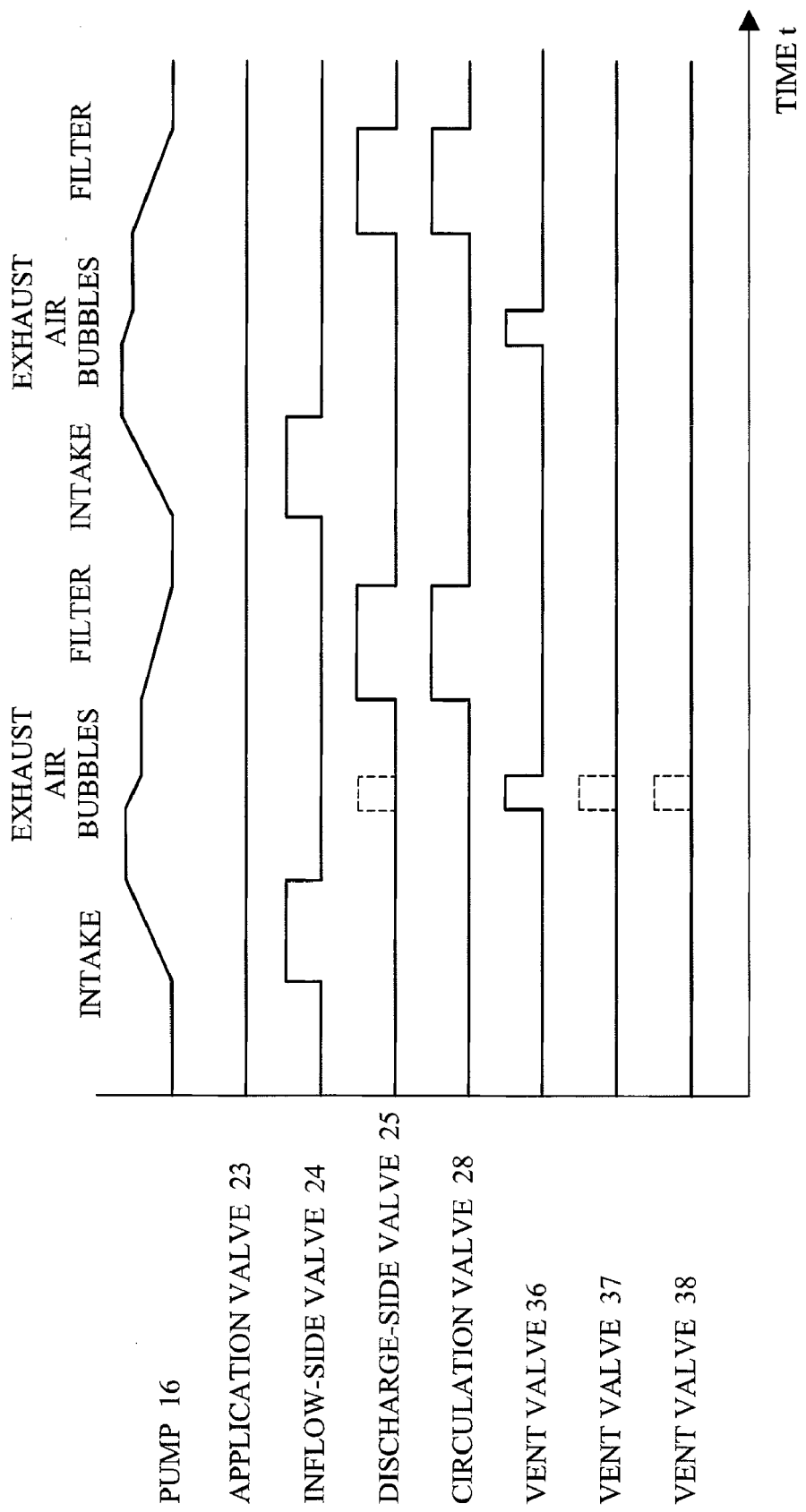

CHEMICAL LIQUID SUPPLY DEVICE

CROSS-REFERENCE TO RELATED APPLICATIONS

Applicant hereby claims foreign priority benefits under U.S.C. §119 from Japanese Patent Application No. 2006-190460 filed on Jul. 11, 2006, the contents of which are incorporated by reference herein.

TECHNICAL FIELD OF THE INVENTION

The present invention relates to a chemical liquid supply technique of supplying chemical liquid such as photoresist solution to a processed object.

BACKGROUND OF THE INVENTION

A microscopic circuit pattern is formed on a surface of a semiconductor wafer, a glass substrate, and the like through a photolithography step or etching step. The chemical liquid supply device has been used in the photolithography step to apply chemical liquid such as photoresist solution to the surface of the wafer or glass substrate, whereby resist solution stored in a chemical liquid tank is sucked up by a pump, passes through a filter and the like, and is applied to a processed object such as the wafer from a nozzle, as described in Japanese Patent Laid-Open Publication No. 9-299862.

A resist processing device called also a spin coater or resist coater has been used to apply the resist solution to the wafer. The resist processing device includes: a chuck attracting a back surface of the wafer and rotating the wafer; and a nozzle for dropping the resist solution on the wafer. The nozzle reciprocates between an applying position and an evacuating position by an arm, and the resist solution is supplied to the nozzle through a supply tube from the pump provided on a main body side of the resist processing device. An application valve provided on the main body side of the resist processing device is operated when dropping the resist solution from the nozzle.

SUMMARY OF THE INVENTION

A property such as viscosity of the resist solution varies with temperature. As the viscosity varies, thickness of a resist film formed by the resist solution applied to the wafer changes and thus the resist solution must be maintained at constant temperature to stabilize the film thickness. For this reason, pure water is circulated through a flow path formed between a supply tube and a temperature adjusting tube which constitute a double pipe by coaxially mounting the temperature adjusting tube outside the supply tube, so that the resist solution flowing through the supply tube is maintained at predetermined temperature. After the resist solution is applied from the nozzle, the resist solution in the supply tube flows and is heated during the flowing. Therefore, length of the double tube is set to, for example, about 1 meter so that the resist solution reaches the set temperature from a time of entering the double tube to a time of reaching the nozzle. If the double tube made of a flexible material is set to such length, when the nozzle reciprocates between an applying position located near a center of rotation of the wafer and a waiting position, the double tube bends so as to follow the nozzle. Accordingly, a reciprocating movement of the nozzle can be made by setting the double tube to the predetermined length.

A plurality of nozzles are normally provided on one resist coater, and the resist solution from different chemical-liquid tanks is supplied to the respective nozzles. Therefore, a plurality of supply systems, for example, eight supply systems each extending from the chemical-liquid tank to the nozzle are provided on the resist coater. A reason for providing the plurality of supply systems in one resist coater in a manner as described above is that: the photolithography step is repeated over a plurality of stages with respect to one wafer to form the circuit patterns; and the resist solution with different properties is used depending on the processing stages. Further reason is that: one resist coater processes a plurality of types of wafers having the circuit patterns different from each other; and the properties of the resist solution must differ from each other depending on the types of wafers. For those reasons, the respective nozzles are supported by a supporting table, and the arm selects the specific nozzle and is moved to the applying position so that the resist solution can be applied from the nozzle.

In the resist coater provided with the plurality of supply systems, one supply system is operated for one-time application while the other supply systems are each in a resting state. The application of liquid onto the wafer is processed approximately every one minute for one wafer, but not all the supply systems are used in order. Some types of resist solution are used only once every few days. While the resist solution is supplied from the chemical-liquid tank to the double tube, micro-bubbles, that is, microscopic air bubbles are removed from the resist solution and foreign substances are removed by a filter. However, if the resist solution is accumulated in the double tube for a long time without being applied from the nozzle, there arises such a drawback that the resist solution gradually gels or changes in quality to produce solid matters or that the producing micro-bubbles occur. If such solution is applied to the wafer, defects of the circuit patterns occur, which results in lowering a yield of wafer manufacture. Therefore, the supply system unused must be also maintained always in a fresh state of the resist solution in the unused supply system by periodically exhausting the resist solution from the nozzle located at the waiting position, and the exhausted resist solution is discarded. The resist solution is very expensive, and a total amount of resist solution periodically discarded becomes enormous. In some of the resist coaters, all the resist solution in the chemical-liquid tank may be sometimes discarded without being used.

The unused supply system cannot be maintained in an empty state. This is because time and trouble are required to prepare one supply system for a usable state. Generally, if interiors of a piping, a pump, and a valve in the supply system is dried up, the resist solution adhering to and remaining on their inner surfaces hardens. For this reason, when the resist solution is newly supplied from the chemical-liquid tank for resist application, solid materials hardened on and adhering to the inner surface flow out as foreign substances and adhere to the wafer, which results in causing any defects of the wafer. Therefore, in the resist coater provided with the plurality of supply systems, all the supply systems must be filled with the resist solution and always maintained in the usable states.

An object of the present invention is to provide a chemical liquid supply device capable of preventing chemical liquid from being discarded.

Another object of the present invention is to provide a chemical liquid supply device capable of applying clean chemical liquid.

A chemical liquid supply device according to the present invention is a device for supplying chemical liquid to a processed object, the device comprising: a moving head including a nozzle for applying the chemical liquid, the moving head reciprocating between an applying position and a waiting position by a reciprocating member; a supply tube connected between the nozzle and a chemical liquid supply unit including a chemical-liquid tank and a pump for discharging the chemical liquid in the chemical liquid tank, the chemical liquid discharged from the pump being supplied to the nozzle by the supply tube; an application valve provided in the moving head and operating so as to take an applying state of applying the chemical liquid from the nozzle at a time of opening a flow path of the supply tube and a stopped state of stopping applying the chemical liquid at a time of closing the flow path; a circulation tube communicating with the supply tube and returning the chemical liquid supplied to the moving head to the chemical liquid supply unit; and a circulation valve operating so as to take a circulating state of returning the chemical liquid from the moving head to the chemical liquid supply unit at a time of opening a flow path of the circulation tube and a circulation-stopped state of stopping returning the chemical liquid at a time of closing the flow path.

The chemical liquid supply device according to the present invention is such that the application valve includes: a valve chamber communicating with the flow path of the supply tube; a discharge port communicating with the flow path of the nozzle; and a valve element operating so as to take a position of causing the valve chamber to communicate with the discharge port and a position of cutting off the communication with the valve chamber and the discharge port, the flow path of the circulation tube being caused to communicate with the flow path of the supply tube through the valve chamber.

The chemical liquid supply device according to the present invention is such that the valve element is a diaphragm valve element contacting with a valve seat between the valve chamber and the discharge port, and a drive rod attached to the diaphragm valve element is driven by a drive means for opening/closing.

The chemical liquid supply device according to the present invention further comprises: a drive means including a driven-side magnet incorporated inside the valve element provided inside a valve-element accommodating chamber forming the valve chamber; and a drive-side magnet provided in the application valve to apply a magnetic force to the driven-side magnet, wherein the drive means operates the valve element for opening/closing.

The chemical liquid supply device according to the present invention further comprises: a temperature adjusting tube provided in the supply tube and forming a temperature-adjusting flow path with the supply tube; a medium guiding tube connecting a supply port of a temperature adjuster for setting a temperature adjusting medium to a predetermined temperature and a basal end of the temperature adjusting tube; and a medium returning tube connecting a returning chamber communicating with an end portion of the temperature-adjusting flow path and a returning port of the temperature adjuster, the returning chamber being formed in the moving head.

The chemical liquid supply device according to the present invention further comprises a suck back valve provided between the nozzle and the application valve and returning the chemical liquid in the nozzle after applying the chemical liquid from the nozzle.

The chemical liquid supply device according to the present invention is such that the chemical liquid supply unit includes a buffer tank provided between the chemical liquid tank and the pump, and connecting the circulation tube to the buffer tank.

A chemical liquid supply method according to the present invention is a method of supplying chemical liquid to a nozzle from a chemical liquid supply unit through a supply tube to apply the chemical liquid from the nozzle to a process object, the nozzle being provided in a moving head reciprocating between an applying position and a waiting position by a reciprocating member, the chemical liquid supply unit having a pump for discharging the chemical liquid in a chemical-liquid tank and a filter for filtering the chemical liquid discharged from the pump, the method comprising: an applying step of driving the pump to apply the chemical liquid from the nozzle while opening an application valve provided in the moving head to communicate with a flow path of the supply tube and a flow path of the nozzle; and a circulating step of driving the pump to return the chemical liquid from the moving head to the chemical liquid supply unit while opening a circulation valve provided in a circulation tube, whose one end is attached to the moving head and whose other end is attached to the chemical liquid supply unit, and while closing the application valve to cut off a flow path of the supply tube and a flow path of the nozzle.

The chemical liquid supply method according to the present invention further comprises an exhausting step of driving the pump to exhaust the chemical liquid containing air bubbles in the chemical liquid supply unit to an outside while opening a vent valve of an exhaust tube provided in the chemical liquid supply unit and exhausting the chemical liquid containing the air bubbles to the outside.

According to the present invention, the application valve is provided in the moving head provided with the nozzle, the supply tube for supplying the chemical liquid discharged by the pump is connected to the application valve, and the chemical liquid sent to the moving head by the supply tube is returned to a side of the chemical liquid supply unit by the circulation tube. Therefore, the chemical liquid can be returned from a side of the moving head through the circulation tube when the nozzle is in a resting state for a long period of time. Accordingly, the returned chemical liquid can be filtered by the filter, and the chemical liquid in the chemical liquid supply system is constantly maintained in a clean state even if the resting state continues.

Since the chemical liquid is returned through the circulation tube for circulating and filtering in advance before applying the chemical liquid from the nozzle, the clean chemical liquid can be applied to the processed object during the application.

In a conventional technique, the chemical liquid has been discarded if the nozzle is in a resting state for a long period of time. However, according to the present invention, the chemical liquid does not need to be discarded since the chemical liquid is circulated and filtered, whereby the processing cost of the processed object is reduced.

BRIEF DESCRIPTION OF THE DRAWINGS

FIG. 11 is a time chart showing yet still another operation example of the chemical liquid supply device according to the present invention.

DESCRIPTION OF THE PREFERRED EMBODIMENTS

Figure 1:
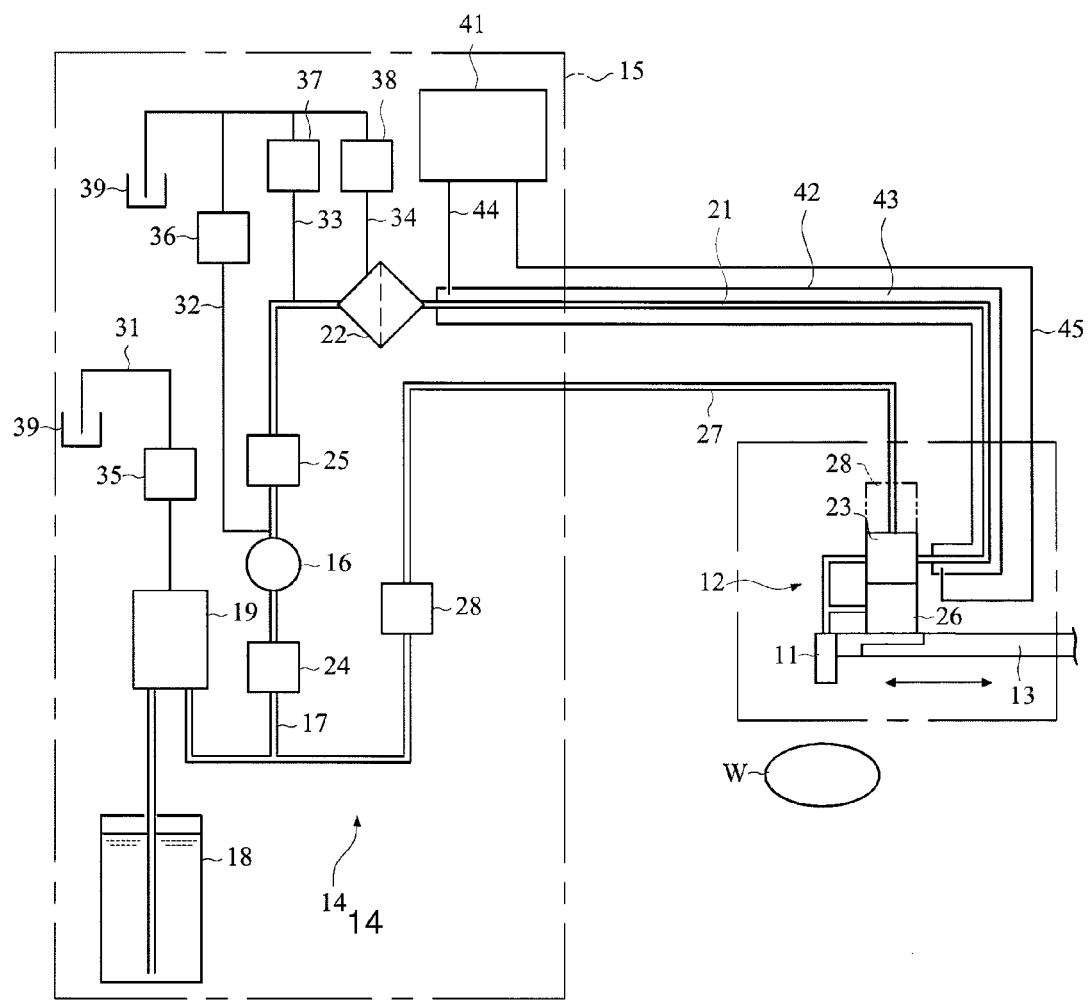
FIG. 1 is a system configuration diagram showing a chemical liquid supply device according to the present invention.

Hereinafter, embodiments of the present invention will be described based on the accompanying drawings. FIG. 1 is a system configuration diagram showing a chemical liquid supply device according to the present invention. This chemical liquid supply device includes a moving head 12 provided with a nozzle 11 for applying resist solution as chemical liquid to a semiconductor wafer serving as a processed object W, wherein the moving head 12 reciprocates, by an arm 13 serving as a reciprocating member, between an applying position shown in FIG. 1 and a waiting position spaced apart from the applying position. The processed object W is attracted on its back surface and rotatably driven by a chuck (not shown), and a portion provided with the chuck acts as a portion of a resist coater. A plurality of moving heads 12 each provided with the nozzle 11 are disposed in a stand section (not shown), and one moving head 12 including the specific nozzle 11 is selected and conveyed to the applying position by the arm 13. After the application is terminated, the moving head 12 is returned to the stand section located at the waiting position by the arm 13.

A chemical liquid supply unit 14 for supplying the chemical liquid to the nozzle 11 is attached on a side of a device main body 15. A plurality of chemical liquid supply units 14 are attached to the device main body 15 so as to correspond to the plurality of nozzles 11, but only one chemical liquid supply unit 14 is shown in FIG. 1. The chemical liquid supply unit 14 includes a pump 16, and an inflow tube 17 is connected to an inflow port of the pump 16, whereby the pump 16 is connected to a chemical-liquid tank 18 through the inflow tube 17. A buffer tank 19 is provided between the pump 16 and the chemical-liquid tank 18. A supply tube 21 is connected to an outflow port of the pump 16, a filter 22 for filtering the chemical liquid discharged from the pump 16 is provided in the supply tube 21, and an end portion of the supply tube 21 is connected to an application valve 23 provided in the moving head 12.

The pump 16 of a type including a volume-variable section that expands and contracts is used. This type of pump includes a diaphragm type pump as disclosed in Japanese Patent Laid-Open Publication No. 8-170744, and further includes a pump comprising, as disclosed in Japanese Patent Laid-Open Publication No. 10-61558, a flexible tube made of an elastic material and elastically deformed in a radial direction, and a bellows disposed outside the flexible tube and provided with a small bellows part and a large bellows part.

An inflow-side valve 24 is provided on an inflow port side of the pump 16, and a discharge-side valve 25 is provided on a discharge side of the pump 16. Therefore, when a volume-variable section constituting the pump 16 expands, if the inflow-side valve 24 is opened and the discharge-side valve 25 is closed, the chemical liquid in the chemical-liquid tank 18 flows into the pump 16. Meanwhile, when the volume-variable section contracts, if the inflow-side valve 24 is closed and the discharge-side valve 25 is opened, the chemical liquid in the pump 16 is discharged towards the nozzle 11.

A discharge port, that is, a secondary side port of the application valve 23 communicates with the nozzle 11, and the application valve 23 operates for opening/closing a flow path of the supply tube 21, thereby taking an applying state of applying the chemical liquid from the nozzle 11 at a time of opening the flow path and a stopped state of stopping the application at a time of closing the flow path. When the application valve 23 opens the flow path, the chemical liquid having been discharged from the pump 16 and filtered by the filter 22 is supplied towards the nozzle 11 through the application valve 23. The filter 22 is fixed in the device main body 15, and at least a portion of the supply tube 21 between the filter 22 and the moving head 12 is formed by a flexible tube, so that the supply tube 21 can carry out a reciprocation of the moving head 12.

A suck back valve 26 is provided in the moving head 12. The application valve 23 is opened to apply a predetermined amount of chemical liquid from the nozzle 11, and then closed to stop the application of the chemical liquid. At this time, in order to prevent liquid dropping from a tip of the nozzle 11 after stopping the application of the chemical liquid, the suck back valve 26 operates to backflow the chemical liquid remaining in the nozzle 11.

One end portion of a circulation tube 27 is connected to a valve chamber acting also as the inflow-side port of the application valve 23, and the other end portion of the circulation tube 27 is connected to the inflow tube 17 of the chemical liquid supply unit 14. Therefore, the chemical liquid supplied to the moving head 12 through the supply tube 21 can be returned to the buffer tank 19 through the circulation tube 27. A circulation valve 28 for opening/closing a flow path in the circulation tube 27 is provided in the circulation tube 27, and such a circulation valve 28 operates so as to take a circulating state of opening the flow path in the circulation tube 27 to return the chemical liquid from the moving head 12 towards the chemical liquid supply unit 14 and a circulation stop state of stopping returning the chemical liquid. Incidentally, one end portion of the circulation tube 27 may be connected to an upstream side of the application valve 23 without being connected to the valve chamber of the application valve 23. In this case, however, since the circulation tube 27 is connected to the valve chamber of the application valve 23, the application valve 23 can be used as a connecting joint of the circulation tube 27, whereby weight of the moving head 12 is prevented from increasing.

The inflow tube 17, the supply tube 21, and the circulation tube 27 are made of fluorocarbon resins such as PFA and PTFE so as not to react with the resist solution that is chemical liquid. Other resin materials may be used depending on the type of chemical liquid.

As shown in FIG. 1, an exhaust tube 31 for exhausting to the outside the chemical liquid containing any air bubbles that may accumulate in an upper part of the buffer tank 19 is connected to the upper part of the buffer tank 19. Further, an exhaust tube 32 is connected to an upper part of the pump 16, an exhaust tube 33 is connected to an upstream side of the filter 22 in the supply tube 21, and an exhaust tube 34 is connected to the filter 22. Vent valves 35 to 38 are provided to the respective exhaust tubes 31 to 34, so that when the vent valves 35 to 38 are opened, the chemical liquid containing gas and air bubbles is exhausted to the outside and collected in a collecting container 39.

Using pure water as a temperature adjusting medium, a temperature adjuster 41 for heating the pure water to predetermined temperature is disposed in the device main body 15. A temperature adjusting tube 42 is coaxially provided outside the supply tube 21 and between the filter 22 and the moving head 12, whereby a temperature adjusting flow path 43 is formed between the temperature adjusting tube 42 and the supply tube 21. The pure water heated to the predetermined temperature is supplied to the temperature adjusting flow path 43 from the temperature adjuster 41 through a medium guiding tube 44 connected between a supply port of the temperature adjuster 41 and a basal end of the temperature adjusting tube 42. A medium returning tube 45 is connected between an end portion of the temperature adjusting tube 42 and a returning port of the temperature adjuster 41, so that the pure water having passed through the temperature adjusting flow path 43 returns to the temperature adjuster 41 through the medium returning tube 45. Therefore, the chemical liquid passing through and filtered by the filter 22 is heated to the predetermined temperature while moving towards the nozzle 11, so that the viscosity of the chemical liquid is set to a predetermined value. Incidentally, although pure water is used as the temperature adjusting medium, liquid other than pure water may be used as the temperature adjusting medium.

Figure 2:
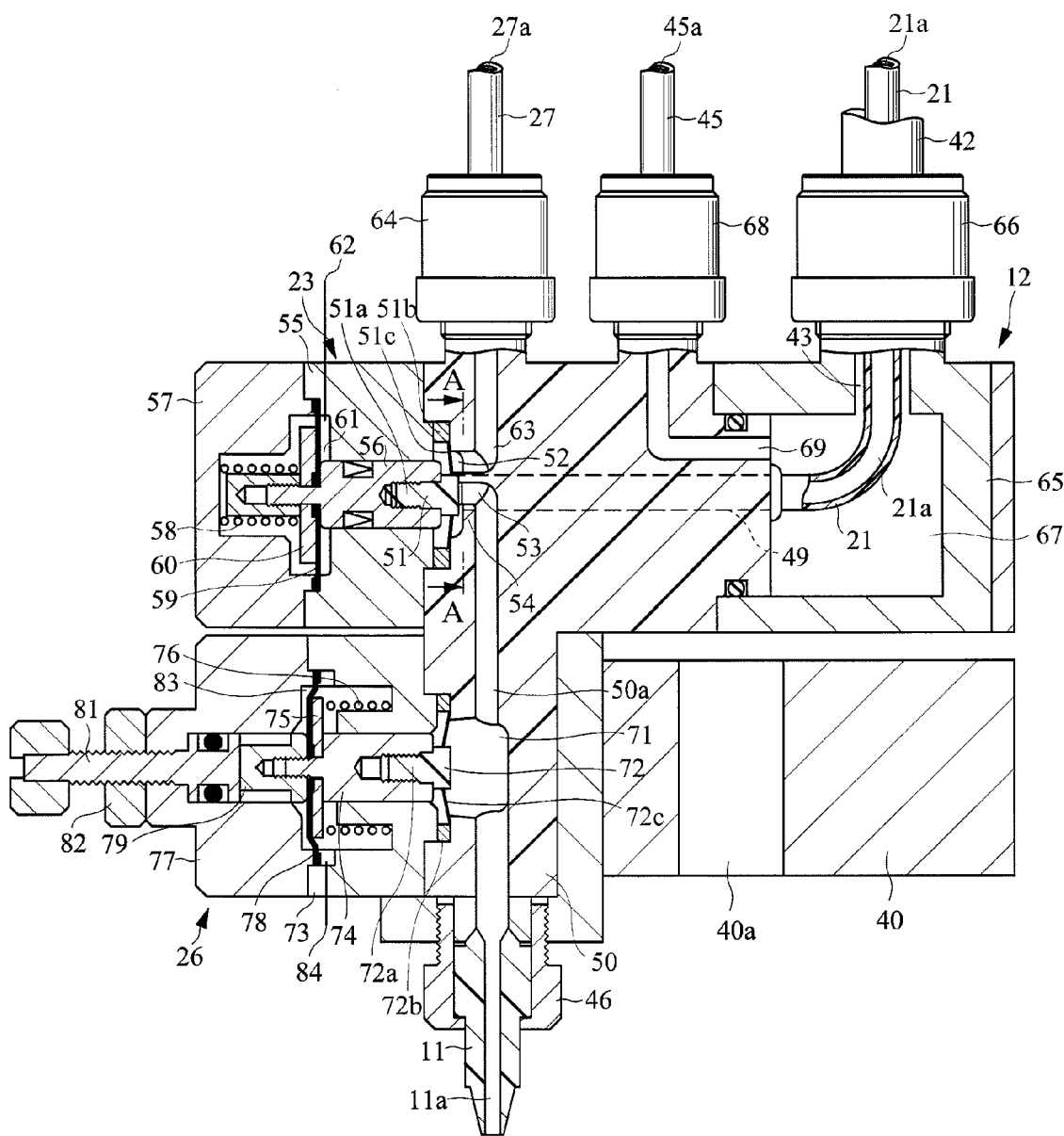
FIG. 2 is a cross-sectional view showing a moving head shown in FIG. 1.
Figure 3:
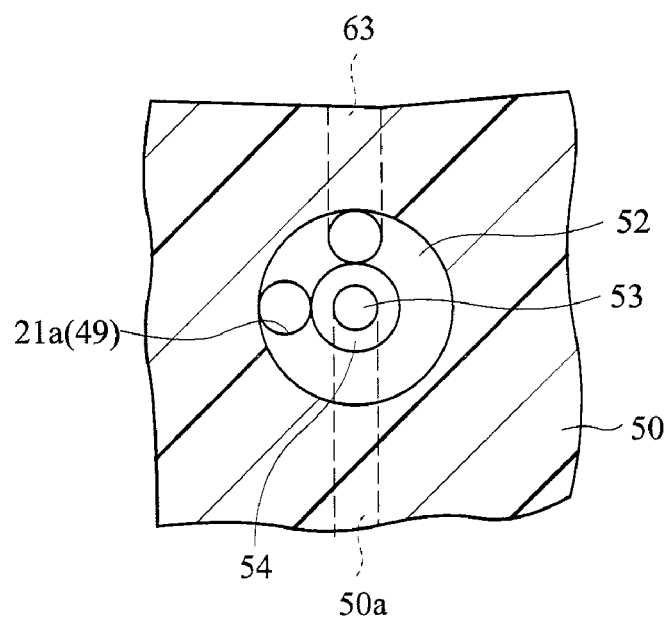
FIG. 3 is an enlarged cross-sectional view taken along line A-A of FIG. 2.

FIG. 2 is a cross-sectional view showing the moving head 12 shown in FIG. 1, and FIG. 3 is an enlarged cross-sectional view taken along line A-A of FIG. 2. The moving head 12 includes a holder 50 made of a fluorocarbon resin, and the holder 50 is provided with the nozzle 11, the application valve 23, and the suck back valve 26.

The nozzle 11 is attached to the holder 50 by a plug 46 removably screwed to the moving head 12, so that the nozzle 11 can be replaced by removing the plug 46. A coupling block 40 is attached to the holder 50, and an engagement hole 40a into which an engagement member such as a pin provided to the arm 13 is inserted is formed in the coupling block 40. Accordingly, the moving head 12 is attached to the arm 13 and conveyed from the waiting position to the applying position.

The application valve 23 includes a diaphragm valve element 51, wherein the diaphragm valve element 51 is made of fluorocarbon resin and includes a shaft part 51a, an annular part 51b, and an elastic deforming part 51c formed integrally therebetween. A supply-side flow path 49 communicating with a flow path 21a in the supply tube 21 is formed in the holder 50. A valve chamber 52 communicating with the flow path 49 is formed with the diaphragm valve element 51. An application flow path 50a communicating with a flow path 11a of the nozzle 11 is formed in the holder 50. The application flow path 50a communicates with the discharge port 53. By the diaphragm valve element 51 abutting on a valve seat 54 formed in the holder 50, the valve chamber 52 of the application valve 23 is switched to a state of communicating with the discharge port 53 and a state of cutting the communication off.

A valve housing 55 is attached to the holder 50, and an annular part 51b of the diaphragm valve element 51 is sandwiched between the valve housing 55 and the holder 50. The shaft part 51a is screwed to a drive rod 56 attached axially movably to the valve housing 55. When the diaphragm valve element 51 moves away from the valve seat 54 by the drive rod 56, the application valve 23 opens the flow path in the supply tube 21, thereby taking a state of applying the chemical liquid from the nozzle 11. When the diaphragm valve element 51 contacts with the valve seat 54, the application valve 23 becomes in a state of stopping applying the chemical liquid from the nozzle 11. Thus, the application valve 23 operates so as to take both states mentioned above.

A cover block 57 is attached to the valve housing 55, and a compression coil spring 58 is mounted in the cover block 57 to apply a spring force to the drive rod 56 in a direction of pushing the diaphragm valve element 51 against the valve seat 54. A diaphragm 59 is provided in the drive rod 56, and its outer circumferential part is sandwiched between the cover block 57 and the valve housing 55. The diaphragm 59 is held by a disk 60 attached to the drive rod 56, and concurrently the compression coil spring 58 is made to abut on the disk 60. A pneumatic chamber 61 is formed between the diaphragm 59 and the valve housing 55, whereby compressed air is supplied from the outside to the pneumatic chamber 61 through a pneumatic pipe 62. When compressed air is supplied into the pneumatic chamber 61 from the pneumatic pipe 62, the drive rod 56 serving as a drive means is driven in a direction of moving away from the valve seat 54 against the spring force, whereby the diaphragm valve element 51 moves away from the valve seat 54 so that the valve chamber 52 and the discharge port 53 become in a state of communicating with each other. The application valve 23 is an air-operated valve that operates by air pressure, but an electromagnetic valve that operates by an electromagnet may be used or the drive rod 56 may be driven by an electrically operated motor.

A returning flow path 63 communicating with the valve chamber 52 is formed in the holder 50, and such a returning flow path 63 communicates with the flow path 27a in the circulation tube 27 connected to the holder 50 by a joint 64. Therefore, the flow path 27a in the circulation tube 27 becomes in a state of constantly communicating with the flow path 21a in the supply tube 21 through the supply-side flow path 49 formed in the holder 50 and the valve chamber 52.

A coupling block 65 is attached to the holder 50, an end portion of the temperature adjusting tube 42 is connected to the coupling block 65 by a joint 66, and the temperature adjusting flow path 43 communicates with a returning chamber 67 formed by the coupling block 65 and the holder 50. A medium returning tube 45 is attached to the holder 50 by a joint 68, and a flow path 45a in the medium returning tube 45 communicates with the returning chamber 67 through a flow path 69. The end of the supply tube 21 is inserted into the returning chamber 67, and the end of the supply tube 21 is connected to the holder 50 so that the flow path 21a and the flow path 49 communicate with each other.

The suck back valve 26 includes a diaphragm valve element 72 for expanding/contracting a volume of the suck back chamber 71 formed in communication with the flow path 50a of the holder 50, wherein the diaphragm valve element 72 is made of a fluorocarbon resin and includes a shaft part 72a, an annular part 72b, and an elastic deforming part 72c formed integrally therebetween.

A valve housing 73 is attached to the holder 50, and the annular part 72b of the diaphragm valve element 72 is sandwiched between the valve housing 73 and the holder 50. The shaft part 72a is screwed to a drive rod 74 mounted axially movably in the valve housing 73, and a holding disk 75 is attached to the drive rod 74 serving as a drive means, wherein a compression coil spring 76 abutting on the holding disk 75 is incorporated in the valve housing 73. Therefore, spring forces are applied to the drive rod 74 and the diaphragm valve element 72 in a direction of expanding the volume of the suck back chamber 71.

A cover block 77 is attached to the valve housing 73, and an outer circumferential part of the diaphragm 78 attached to the drive rod 74 is sandwiched between the cover block 77 and the valve housing 73. An adjustment rod 79 incorporated in the cover block 77 is coupled to the drive rod 74, so that the adjustment rod 79 can abut on a stroke adjustment screw 81 attached to the cover block 77. A fastening nut 82 is screwed into the stroke adjustment screw 81. A pneumatic chamber 83 is formed between the diaphragm 78 and the cover block 77, and compressed air is supplied from the outside to the pneumatic chamber 83 through a pneumatic pipe 84. When compressed air is supplied into the pneumatic chamber 83 from the pneumatic pipe 84, the drive rod 74 and the diaphragm valve element 72 are driven in a direction of contracting the volume of the suck back chamber 71 against the spring forces. Therefore, while compressed air is supplied into the pneumatic chamber 83 to contract a volume of the suck back chamber 71, when the chemical liquid is applied from the nozzle 11 and then the compressed air in the pneumatic chamber 83 is exhausted to the outside, the volume of the suck back chamber 71 is expanded by the spring forces to return the chemical liquid remaining in the flow path 11a of the nozzle 11. Therefore, the chemical liquid is prevented from dropping from the nozzle 11. An amount of resist solution sucked back can be varied by adjusting the stroke adjustment screw 81. Similar to the application valve 23, the suck back valve 26 is also an air-operated valve that operates by air pressure, but an electromagnetic valve that operates by an electromagnet may be used or the drive rod 74 may be driven by an electrically operated motor.

When the application valve 23 is opened to apply a predetermined amount of chemical liquid from the nozzle 11 and then the application valve 23 is closed, the diaphragm valve element 51 moves closer to the valve seat 54 and the chemical liquid is slightly pushed out to the discharge port 53 or liquid droplets remain in the nozzle 11 due to the property of the chemical liquid. However, the liquid dropping from the tip portion of the nozzle 11 is prevented by operating the suck back valve 26 to increase the volume of the suck back chamber 71.

Incidentally, as shown in FIG. 1, the circulation valve 28 is attached to the device main body 15. However, as shown by a double-dot line in FIG. 1, the circulation valve 28 may be attached to the moving head 12. If the circulation valve 28 is attached to the moving head 12, a flow path in that portion of the circulation tube 27 which moves with the moving head 12 is cut off from the valve chamber 52 by the circulation valve 28. Therefore, pressure fluctuation caused by a movement of the chemical liquid remaining in the flow path of the portion that moves with the moving head 12 is prevented from influencing the chemical liquid in the valve chamber 52.

Figure 4:
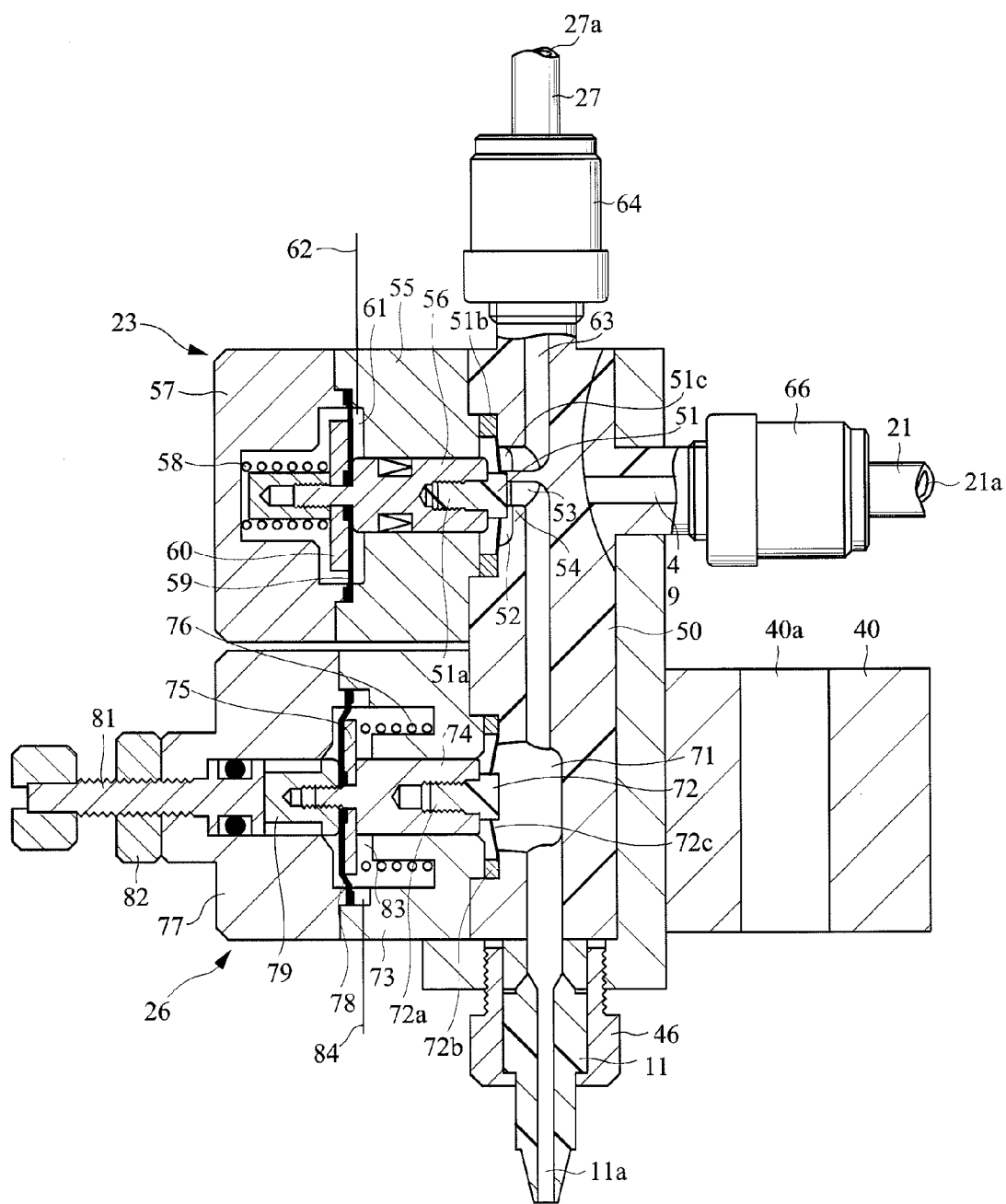
FIG. 4 is a cross-sectional view showing a modification of the moving head.

FIG. 4 is a cross-sectional view showing a modification of the moving head 12. In FIG. 4, members common to those shown in FIG. 2 are denoted by the same reference numerals.

The moving head 12 shown in FIG. 4 is used for a chemical liquid supply device in which the temperature adjuster 41 shown in FIG. 1 is not used. Therefore, the supply tube 21 is mounted on the joint 66, the temperature adjusting tube 42 is not provided outside the supply tube 21, the flow path 49 communicating with the flow path 21a of the supply tube 21 is formed in the holder 50, and the flow path 49 communicates with the valve chamber 52 of the application valve 23.

Figure 5:
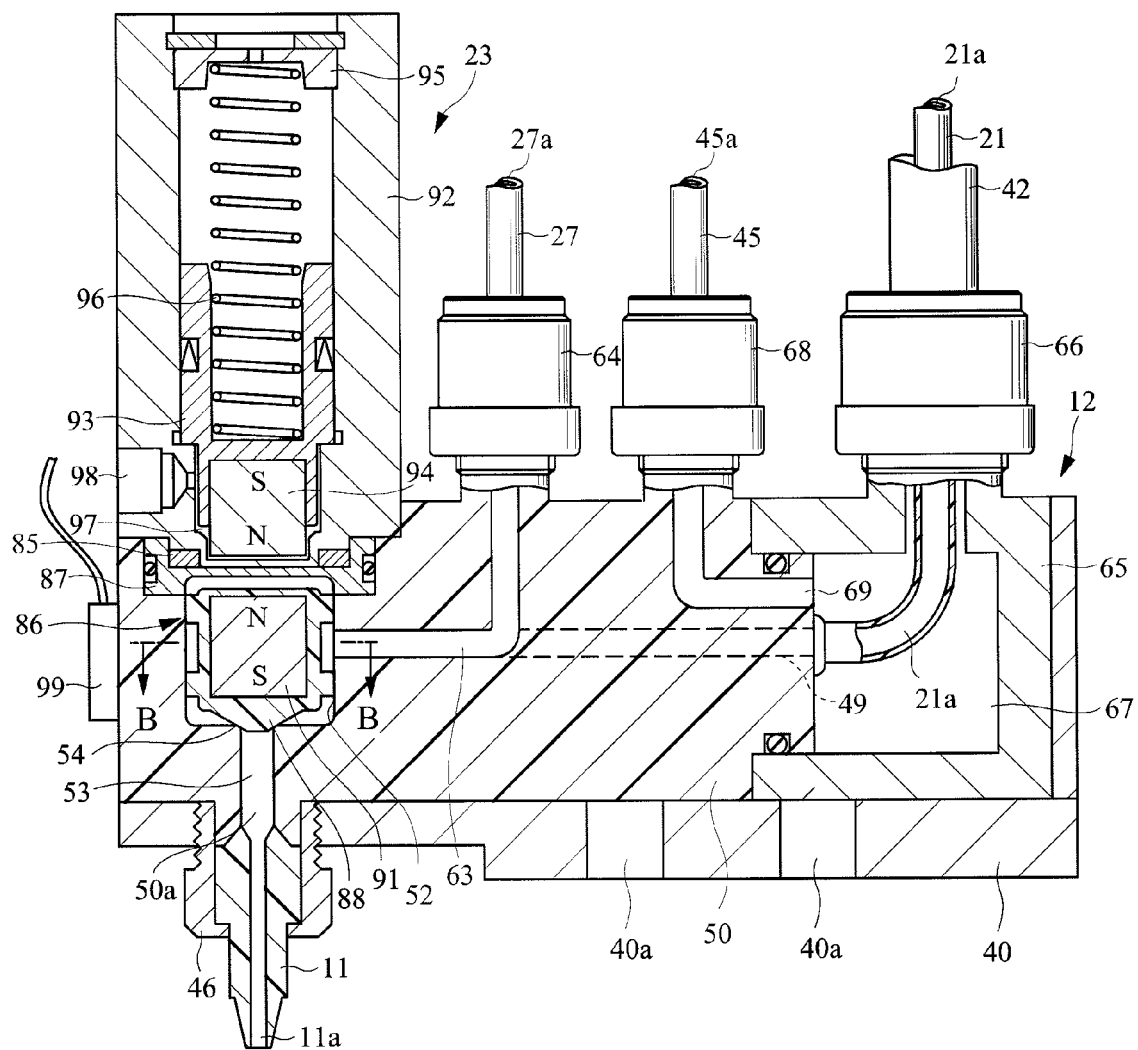
FIG. 5 is a cross-sectional view showing another modification of the moving head.
Figure 6A:
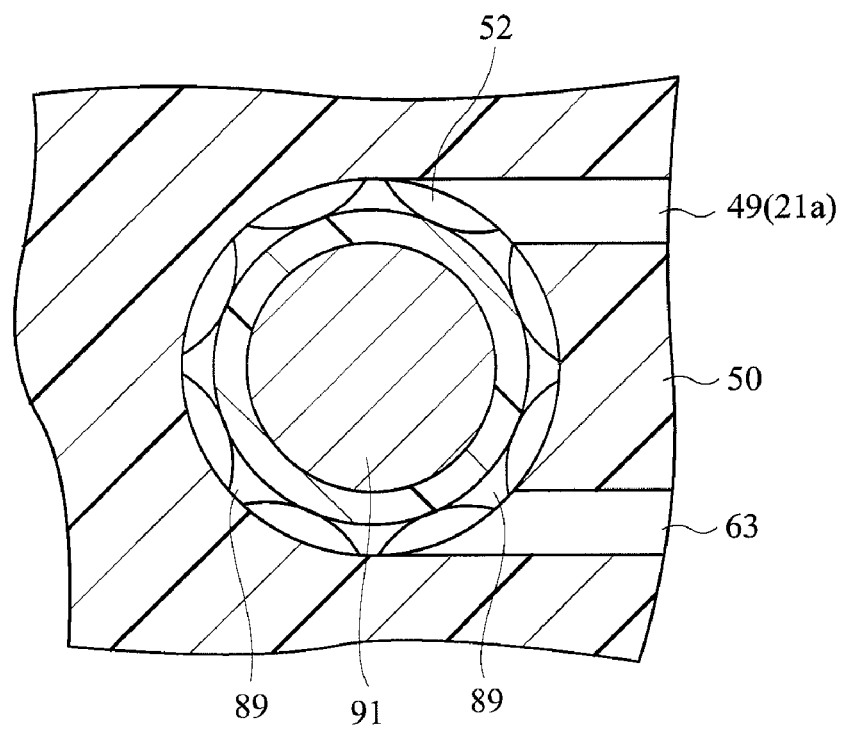
FIG. 6A is an enlarged cross-sectional view taken along line B-B of FIG. 5.
Figure 6B:
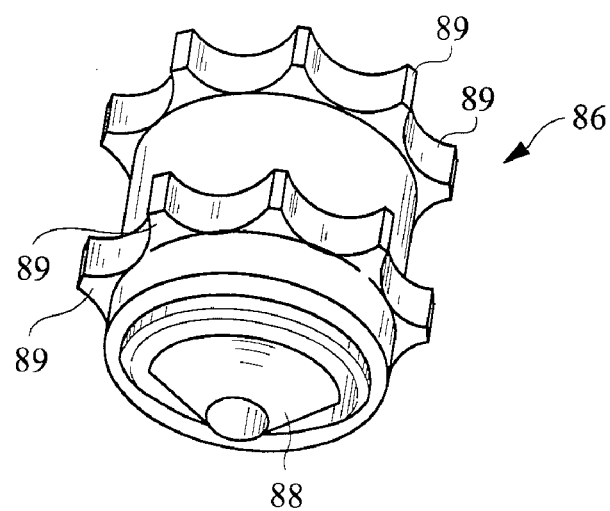
FIG. 6B is an enlarged perspective view of a valve element shown in FIG. 5.

FIG. 5 is a cross-sectional view showing another modification of the moving head 12; FIG. 6A is an enlarged cross-sectional view taken along line B-B of FIG. 5; and FIG. 6B is an enlarged perspective view of a valve element shown in FIG. 5. The moving head 12 shown in FIG. 5 is used, similarly to the case shown in FIG. 2, for a chemical liquid supply device in which the temperature adjuster 41 is used. However, a constitution of the application valve 23 shown in FIG. 5 differs from that described above.

The valve chamber 52 is formed in the holder 50 by a valve-element accommodating chamber with a cylindrical shape. The valve chamber 52 communicates with the flow path 21a of the supply tube 21 through the flow path 49 formed in the holder 50, and the returning flow path 63 communicating with the flow path 27a of the circulation tube 27 communicates with the valve chamber 52. The flow path 49 and the flow path 63 are formed in the holder 50 in a direction tangent to an inner circumferential surface of the valve chamber 52 with a cylindrical shape, and communicate with the valve chamber 52 at positions mutually shifted by 180 degrees in a circumferential direction. Thus, the chemical liquid supplied from the pump 16 flows into the valve chamber 52 from the flow path 49, and smoothly returns to the buffer tank 19 from the flow path 63 while being whirled.

An application flow path 50a communicating with the flow path 11a of the nozzle 11 is opened in a bottom surface of the valve chamber 52, whereby a portion of the application flow path 50a serves as the discharge port 53. A valve element 86 made of a resin is incorporated in the valve chamber 52, thereby operating at a position of communicating with the valve chamber 52 and the discharge port 53 and at a position of cutting the communication off. In the valve chamber 52, a surface facing to the bottom surface is closed by a resin-made cover 87 attached to the holder 50, and a magnetic ring 85 made of a ferromagnetic material is attached outside the cover 87.

The valve element 86 of the application valve 23 is different from the diaphragm valve element described above and is entirely formed into a cylindrical shape as shown in FIG. 6B. One end portion of the valve element is provided with a tapered contacting part 88 which abuts on the valve seat 54.

Both end portions of the valve element 86 are each provided with a plurality of projections 89, each of which is disposed circumferentially at a predetermined interval and protrudes in an radial-outer direction. Accordingly, a tip of each projection 89 contacts with an inner circumferential surface of the cylindrical valve chamber 52, and a space between the projections 89 circumferentially adjacent to each other is a concave part the chemical liquid enters. A driven-side magnet 91 is embedded inside the valve element 86, and the magnet 91 is not exposed from a surface of the resin-made valve element 86, thereby avoiding contacting with the chemical liquid and the magnet 91.

A pneumatic cylinder 92 made of a non-magnetic material such as an aluminum alloy is attached to the holder 50, and a drive-side magnet 94 is incorporated in a piston 93, which is made of a non-magnetic material and incorporated inside the pneumatic cylinder 92. An interior of the pneumatic cylinder 92 is partitioned into two chambers, i.e., a spring chamber located on a basal end side of the pneumatic cylinder 92 and a pneumatic chamber 97 located on a tip side thereof. A compression coil spring 96 is mounted between a spring receiver 95 in the spring accommodating chamber and the piston 93, so that a spring force directed towards the valve chamber 52 is applied to the piston 93.

The magnets 91 and 94 are disposed so that their portions with inverse polarity face to each other. When being shown in the drawings, the magnets 91 and 94 are disposed so that their N-pole sides face to each other. Thus, when the piston 93 is moved closer to the valve element 86 by the spring force, the valve element 86 is pushed against the valve seat 54 by a repulsive force caused between the magnets. Meanwhile, if the piston 93 is moved in a direction of moving away from the valve element 86, the magnetic ring 85 disposed outside the cover 87 is magnetized by the magnet 91 in the valve element 86, and the magnet 91 is attracted towards the magnetic ring 85, whereby the valve element 86 moves away from the valve seat 54. In order to drive the piston 93 in the direction of moving away from the valve element 86, the pneumatic chamber 97 is formed at the end portion of the pneumatic cylinder 92. When compressed air is supplied from a supply/exhaust port 98 communicating with the pneumatic chamber 97, the piston 93 is driven in the direction of moving away from the valve element 86. The pneumatic chamber 97 is separated from the cover 87 by a thin portion provided at the end portion of the pneumatic cylinder 92.

A sensor 99 is attached to the holder 50 shown in FIG. 5 in order to detect whether the valve element 86 is in a state of closing the flow path or in a state of opening the flow path. A detection signal is sent to a control section (not shown). Incidentally, the sensor 99 may be attached also to the application valve 23 in the moving head 12 in order to detect an operating state of the valve element.

Figure 7:
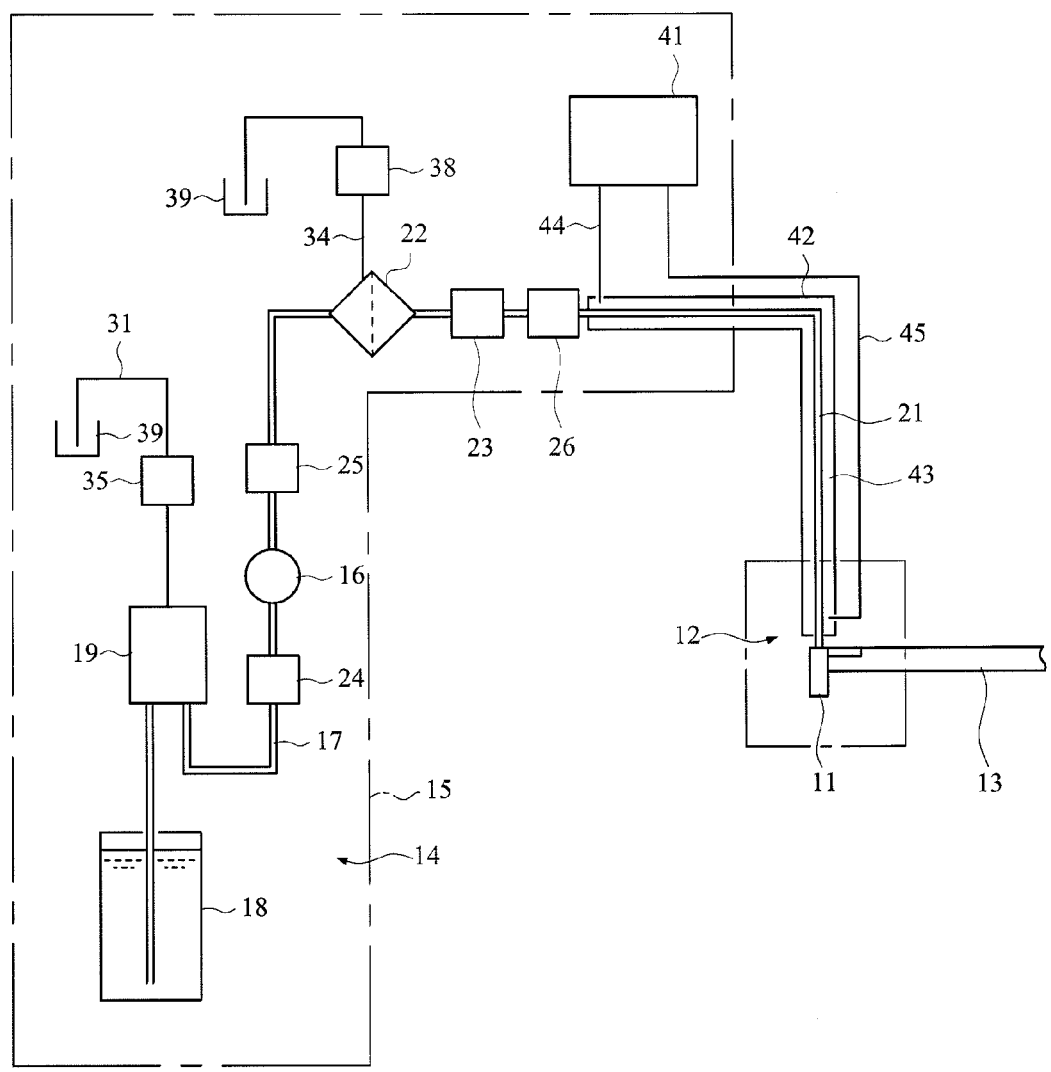
FIG. 7 is a system configuration diagram of a chemical liquid supply device given as a comparative example.

FIG. 7 is a system configuration diagram of a chemical liquid supply device given as a comparative example, wherein members common to those in the chemical liquid supply device of the present invention shown in FIG. 1 are denoted by the same reference numerals. In the chemical liquid supply device shown in FIG. 7, the application valve 23 and the suck back valve 26 are disposed in the device main body 15, and the nozzle 11 attached to the moving head 12 and the suck back valve 26 are connected through the supply tube 21. In such a chemical liquid supply device, when the supply system shown in FIG. 7 is in a resting state for a long period of time, a state in which the chemical liquid is not applied from the nozzle 11 continues, whereby the chemical liquid is accumulated in the supply tube 21 for a long period of time. If the chemical liquid is accumulated in the supply tube 21 for a long period of time, there arises such a drawback that the chemical liquid changes in quality to produce solid materials or micro-bubbles occur.

In contrast, in the chemical liquid supply device of the present invention shown in FIG. 1, the application valve 23 is mounted to the moving head 12, and the chemical liquid in the supply tube 21 can be circulated and moved from a side of the moving head 12 by the circulation tube 27, whereby the chemical liquid in the supply tube 21 are prevented from being accumulated over a long period of time. Therefore, although the chemical liquid not applied to the processed object W and accumulated in the supply tube 21 over a long period of time needs to be discarded in a conventional technique, the present invention can apply the clean chemical liquid to the processed object without discarding the chemical liquid, thereby reducing the cost of manufacturing the processed object.

Figure 8:
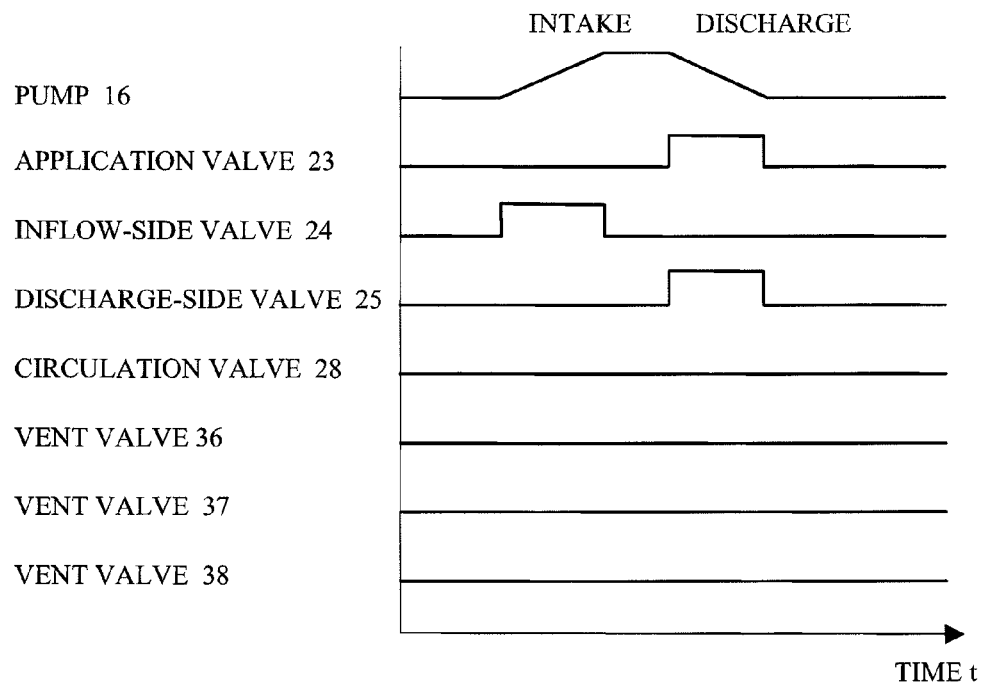
FIG. 8 is a time chart showing an operation example of the chemical liquid supply device according to the present invention.

FIG. 8 is a time chart showing an operation example of the chemical liquid supply device according to the present invention. In applying the chemical liquid from the nozzle 11, the volume-variable section of the pump 16 is first expanded to take in the chemical liquid into the pump 16. At this time, the inflow-side valve 24 is opened. After such an intake operation is terminated, the volume-variable section of the pump 16 is contracted to perform a discharging operation of the chemical liquid from the pump 16. In this case, the discharge-side valve 25 is opened and the application valve 23 is opened. Accordingly, the chemical liquid in the pump 16 is supplied towards the nozzle 11 through the filter 22.

Figure 9:
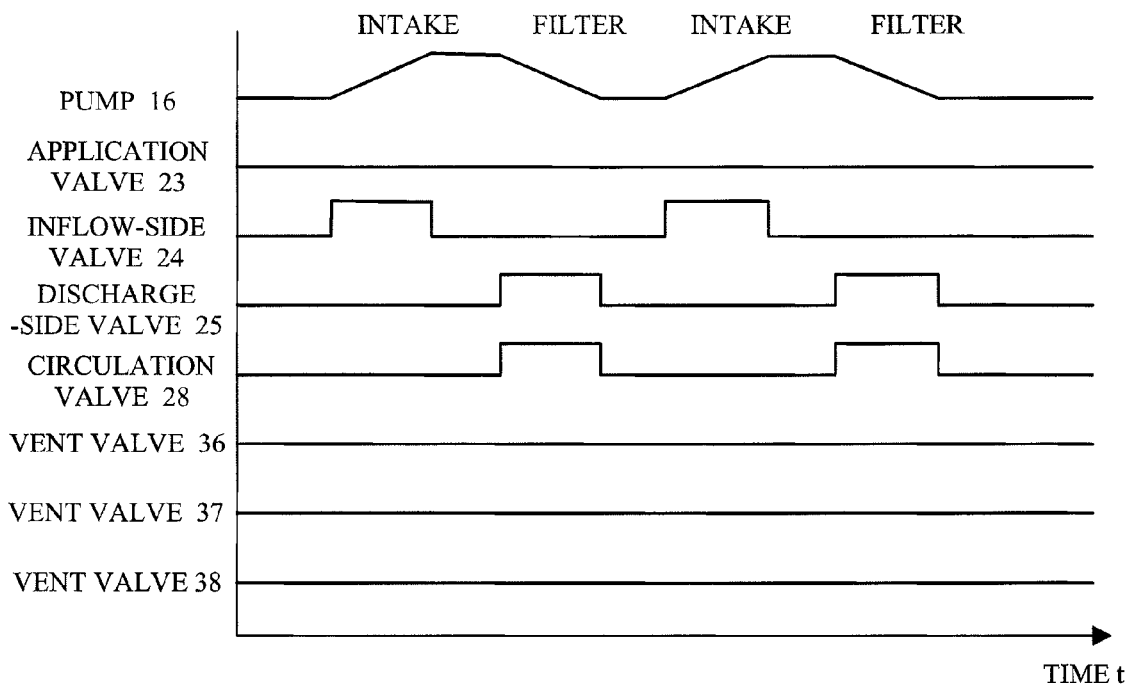
FIG. 9 is a time chart showing another operation example of the chemical liquid supply device according to the present invention.

FIG. 9 is a time chart showing another operation example of the chemical liquid supply device according to the present invention. After the intake operation of the pump 16 is terminated, the volume-variable section of the pump 16 is contracted to perform the discharging operation of the chemical liquid from the pump 16. At this time, while the application valve 23 is closed, the discharge-side valve 25 and the circulation valve 28 are opened. Thus, the chemical liquid supplied to a side of the moving head 12 through the supply tube 21 returns towards the buffer tank 19 through the circulation tube 27. By repeating the above circulating step over a plurality of times, a predetermined amount of chemical liquid is returned to the buffer tank 19 and is again made to pass through the filter 22 for filtering. That is, the chemical liquid can be circulated and filtered over the plurality of times, thereby being prevented from being accumulated in the supply tube 21 for a long period of time even if the nozzle 11 is in the resting state.

Figure 10:
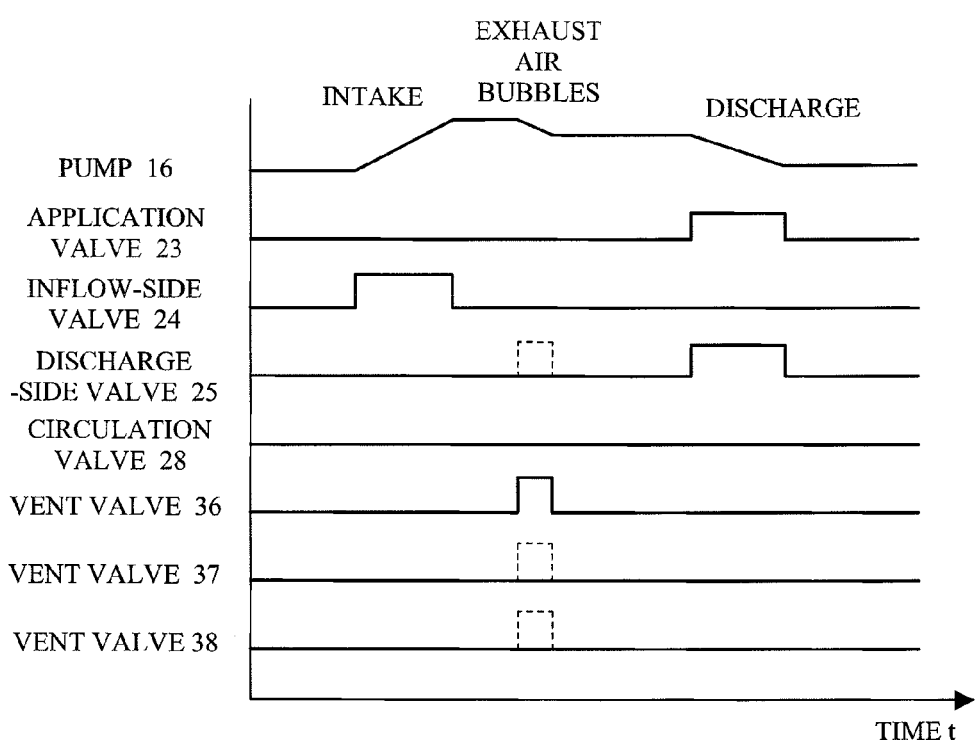
FIG. 10 is a time chart showing still another operation example of the chemical liquid supply device according to the present invention.

FIG. 10 is a time chart showing still another operation example of the chemical liquid supply device according to the present invention. When the volume-variable section of the pump 16 is slightly contracted and the vent valve 36 is opened after the intake operation of the pump 16 is terminated and before the chemical liquid is applied from the nozzle 11, the chemical liquid containing air bubbles can be exhausted to the outside from the exhaust tube 32 connected to the upper part of the pump 16. Thus, when the chemical liquid containing air bubbles is exhausted from the vent valve 36 to the outside, the discharge-side valve 25 may remain closed. However, the chemical liquid containing the air bubbles may be exhausted to the outside from the vent valves 37 and 38 without being exhausted from the vent valve 36. In this case, as shown by a broken line in FIG. 10, the discharge-side valve 25 is opened and the vent valves 37 and 38 are opened. Accordingly, the chemical liquid containing air bubbles can be exhausted to the outside through the exhaust tubes 33 and 34 from the upstream side of the filter 22 and from the interior of the filter 22. The chemical liquid containing the air bubbles may be exhausted to the outside from the respective vent valve 36 to 38.

FIG. 11 is a time chart showing yet still another operation example of the chemical liquid supply device according to the present invention. In a process shown by FIG. 11, circulation and filtration shown in FIG. 9 and exhaust of the chemical liquid containing air bubbles shown in FIG. 10 are repeatedly performed. Thus, filtration of the chemical liquid in the flow path and removal of air bubbles are performed before the chemical liquid is applied from the nozzle 11.

The present invention is not limited to the above embodiments, and may be variously modified and varied within the scope of not deviating from the gist thereof. For example, the illustrated chemical liquid supply device is adopted to apply the resist solution to the semiconductor wafer serving as the processed object. However, the processed object is not limited thereto, and the chemical liquid supply device according to the present invention may be adopted even when the chemical liquid is applied to other processed objects such as a liquid crystal panel.

What is claimed is:

1. A chemical liquid supply device for supplying chemical liquid to a processed object, the device comprising:

a moving head including a nozzle for applying the chemical liquid, the moving head reciprocating between an applying position and a waiting position by a reciprocating member;

a supply tube connected between the nozzle and a chemical liquid supply unit including a chemical-liquid tank, a pump for discharging the chemical liquid in the chemical liquid tank, and a filter for filtering the chemical liquid discharged from the pump, the chemical liquid discharged from the pump being supplied to the nozzle by the supply tube;

a circulation tube communicating with the supply tube and returning the chemical liquid supplied to the moving head to the chemical liquid supply unit;

a circulation valve operating between a circulating state, in which returning of the chemical liquid from the moving head to the chemical liquid supply unit is facilitated by opening a flow path of the circulation tube and a circulation-stopped state, in which stopping returning of the chemical liquid is facilitated by closing the flow path; and an application valve provided in the moving head and operable to select an applying state of applying the chemical liquid from the nozzle at a time of opening a flow path of the supply tube and a stopped state of not applying the chemical liquid at a time of closing the flow path, the application valve further comprising:

a holder enclosing a valve chamber, which communicates with the flow path of the supply tube and communicates with the nozzle via a discharge port, and which includes a valve seat surrounding the discharge port;

a valve element which has one end portion provided with a contacting portion, the valve element being movably housed in the holder such that a gap for flow of the chemical liquid is formed between an inner surface of the valve chamber and an outer surface of the valve element, the valve element moving between a closed position where the contacting portion contacts the valve seat to cut off communication between the valve chamber and the discharge port in the stopped state of the application valve and an opened position where the valve element moves away from the valve seat to cause the valve chamber and the discharge port to communicate with each other in the applying state of the application valve;

a driven-side magnet embedded in the valve element;

a magnetic ring made of a ferromagnetic material and mounted adjacent the valve chamber opposite the valve seat to attract the driven-side magnet; and a drive-side magnet movably connected to the holder opposite the driven-side magnet and driven between a close position adjacent the magnetic ring and repelling the driven-side magnet and a distant position away from the magnetic ring, wherein when the drive-side magnet reaches the distant position the driven-side magnet magnetizes and is attracted by the magnetic ring to move the valve element to the opened position, and when the drive-side magnet reaches the close position the driven-side magnet is repelled by the drive-side magnet to move the valve element to the closed position.

2. The chemical liquid supply device according to claim 1, wherein the flow path of the circulation tube is caused to communicate with the flow path of the supply tube through the valve chamber.

3. The chemical liquid supply device according to claim 2, wherein the one end portion and the other end portion of the valve element are each provided with a plurality of projections, each of the projections disposed circumferentially at a predetermined interval and protruding in a radially-outward direction, and wherein the valve element is made of a resin.

4. The chemical liquid supply device according to claim 3, further comprising:

a temperature adjusting tube provided around the supply tube and forming a temperature-adjusting flow path with the supply tube;

a medium guiding tube connecting a supply port of a temperature adjuster for setting a temperature adjusting medium to a predetermined temperature and a basal end of the temperature adjusting tube; and a medium returning tube connecting a returning chamber communicating with an end portion of the temperature-adjusting flow path and a returning port of the temperature adjuster, the returning chamber being formed in the moving head.

5. The chemical liquid supply device according to claim 3, further comprising a suck back valve provided between the nozzle and the application valve and returning the chemical liquid in the nozzle after applying the chemical liquid from the nozzle.

6. The chemical liquid supply device according to claim 3, wherein the chemical liquid supply unit includes a buffer tank provided between the chemical liquid tank and the pump, wherein the circulation tube is connected to the buffer tank.

7. The chemical liquid supply device according to claim 2, further comprising:

a temperature adjusting tube provided around the supply tube and forming a temperature-adjusting flow path with the supply tube;

a medium guiding tube connecting a supply port of a temperature adjuster for setting a temperature adjusting medium to a predetermined temperature and a basal end of the temperature adjusting tube; and a medium returning tube connecting a returning chamber communicating with an end portion of the temperature-adjusting flow path and a returning port of the temperature adjuster, the returning chamber being formed in the moving head.

8. The chemical liquid supply device according to claim 2, further comprising a suck back valve provided between the nozzle and the application valve and returning the chemical liquid in the nozzle after applying the chemical liquid from the nozzle.

9. The chemical liquid supply device according to claim 2, wherein the chemical liquid supply unit includes a buffer tank provided between the chemical liquid tank and the pump, wherein the circulation tube is connected to the buffer tank.

10. The chemical liquid supply device according to claim 1, further comprising:

a temperature adjusting tube provided around the supply tube and forming a temperature-adjusting flow path with the supply tube;

a medium guiding tube connecting a supply port of a temperature adjuster for setting a temperature adjusting medium to a predetermined temperature and a basal end of the temperature adjusting tube; and a medium returning tube connecting a returning chamber communicating with an end portion of the temperature-adjusting flow path and a returning port of the temperature adjuster, the returning chamber being formed in the moving head.

11. The chemical liquid supply device according to claim 1, further comprising a suck back valve provided between the nozzle and the application valve and returning the chemical liquid in the nozzle after applying the chemical liquid from the nozzle.

12. The chemical liquid supply device according to claim 1, wherein the chemical liquid supply unit includes a buffer tank provided between the chemical liquid tank and the pump, wherein the circulation tube is connected to the buffer tank.

* * * * *